(12) United States Patent
Visani et al.

(10) Patent No.: US 9,209,825 B1
(45) Date of Patent: Dec. 8, 2015

(54) METHODS FOR SAMPLING TIME SKEW COMPENSATION IN TIME-INTERLEAVED ANALOG TO DIGITAL CONVERTERS

(71) Applicant: Marvell International Ltd., Hamilton HM 12 (BM)

(72) Inventors: Davide Visani, Pavia (IT); Luca Vercesi, Pavia (IT); Fernando De Bernardinis, Pavia (IT)

(73) Assignee: MARVELL INTERNATIONAL LTD., Hamilton (BM)

( * ) Notice: Subject to any disclaimer, the term of this patent is extended or adjusted under 35 U.S.C. 154(b) by 0 days.

(21) Appl. No.: 14/516,411

(22) Filed: Oct. 16, 2014

Related U.S. Application Data

(60) Provisional application No. 61/894,189, filed on Oct. 22, 2013.

(51) Int. Cl.
  *H03M 1/06* (2006.01)
  *H03M 1/12* (2006.01)
  *G04F 10/00* (2006.01)

(52) U.S. Cl.
  CPC ........... *H03M 1/1255* (2013.01); *G04F 10/005* (2013.01)

(58) Field of Classification Search
  CPC . H03M 1/1215; H03M 1/168; H03M 1/0673; H03M 1/50; H03M 1/164; H03M 1/1245; H03M 1/1061; H03M 1/1255; G04F 10/005
  USPC .................................................. 341/118–155
  See application file for complete search history.

(56) References Cited

U.S. PATENT DOCUMENTS

| | | | | |
|---|---|---|---|---|
| 5,173,953 | A  * | 12/1992 | Wataya et al. | 382/305 |
| 7,916,050 | B1 * | 3/2011 | Mujica et al. | 341/118 |
| 2012/0050079 | A1 * | 3/2012 | Goldman et al. | 341/118 |
| 2013/0241755 | A1 * | 9/2013 | Chen et al. | 341/120 |

OTHER PUBLICATIONS

Shwetabh Verma et al., "A 10.3GS/s 6b Flash ADC for 10G Ethernet Applications", 2013 IEEE International Solid-State Circuits Conference, Feb. 20, 2013, pp. 462-463, Broadcom, Santa Clara, CA.

* cited by examiner

*Primary Examiner* — Lam T Mai

(57) ABSTRACT

An apparatus comprises a plurality of Analog to Digital Converter circuits (ADCs) and a skew detector configured to determine a plurality of indicators corresponding to a plurality of sampling time skews of the plurality of ADCs, respectively. The plurality of ADCs is configured to adjust the plurality of sampling time skews according to the plurality of indicators, respectively. The apparatus is configured to reach an equilibrium state wherein the plurality of indicators are substantially equal. In an embodiment, the apparatus comprises a Time-Interleaved ADC including the plurality of ADCs. A method comprises measuring a plurality of indicators of a plurality of sampling time skews, respectively. The plurality of sampling time skews are associated with a plurality of ADCs, respectively. The plurality of sampling time skews are adjusted according to respective indicators of the plurality of indicators.

19 Claims, 6 Drawing Sheets

METHODS FOR SAMPLING TIME SKEW COMPENSATION IN TIME-INTERLEAVED ANALOG TO DIGITAL CONVERTERS

CROSS REFERENCE TO RELATED APPLICATION

This present disclosure claims the benefit of U.S. Provisional Application No. 61/894,189, filed on Oct. 22, 2013, which is incorporated by reference herein in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In a high speed serial communication link, such as a 10 Gigabit (10 G) or 100 Gigabit (100 G) Ethernet connection, a transmitter transmits a data signal into a communication channel (channel). The data signal includes a sequence of symbols, each symbol carrying information from some number of bits, such as one, two, or more bits, or in some cases fractions of bits. The data signal may be an analog data signal.

The symbols are transmitted at a modulation rate expressed in baud, where one baud is one symbol per second. The duration of each symbol is known as the Unit Interval (UI).

In order to receive the data on the communication link, a receiver converts the analog data signal into a digital signal using an Analog to Digital Converter circuit (ADC). The ADC may perform one analog to digital conversion during each UI or may perform a plurality of analog to digital conversions during each UI.

At high sampling rates, a Time-Interleaved ADC (TI-ADC) may be used to perform the analog to digital conversions. A TI-ADC includes a plurality of ADCs that operate in parallel. In a TI-ADC performing one analog to digital conversion per sampling period with a duration of S nanoseconds and including N ADCs, that is, an "N-times TI-ADC," the TI-ADC may operate using N sampling clocks each having a period of N·S nanoseconds and each lagging the previous sampling clock by S nanoseconds, each of the N sampling clocks controlling a respective one of the N ADCs. The output of the TI-ADC is a composition of the N ADCs of the TI-ADC. When all of the N ADCs operate identically, the composition of all N ADC outputs is equivalent to a single ADC performing sampling and conversion once every S nanoseconds.

That is, in the N-time TI-ADC, each of N ADCs samples the analog data signal once every N·S nanoseconds and then perform a conversion on the sampled signal: a first ADC samples the analog data signal at 0, N·S, 2N·S, ... nanoseconds; a second ADC samples the analog data signal at S, (N+1)·S, (2N+1)·S, ... nanoseconds; and so on; and an $N^{th}$ ADC samples the analog data signal at (N−1)·S, (2N−1)·S, (3N−1)·S, ... nanoseconds. Because each ADC of the TI-ADC performs sampling and conversion for only 1/N of the sampling periods, each ADC may operate at a substantially slower speed than an ADC capable of performing conversions at a rate corresponding to the sampling period.

The quality of the output of the TI-ADC depends on the individual ADCs of the TI-ADC operating with a high degree of uniformity. However, because of manufacturing and environmental variations, operational characteristics that affect uniformity of an ADC's operation may vary among the individual ADCs of the TI-ADC.

SUMMARY

In an embodiment, an apparatus comprises a plurality of Analog to Digital Converter circuits (ADCs) and a skew detector configured to determine a plurality of indicators corresponding to a plurality of sampling time skews of the plurality of ADCs, respectively.

In an embodiment, the plurality of ADCs is configured to adjust the plurality of sampling time skews according to the plurality of indicators, respectively.

In an embodiment, the apparatus is configured to reach an equilibrium state wherein the plurality of indicators are substantially equal.

In an embodiment, the plurality of indicators includes a plurality of outputs of a plurality of Timing Error Detection circuits (TEDs) coupled to the plurality of ADCs, respectively.

In an embodiment, the apparatus comprises a plurality of equalizer circuits coupled to the plurality of ADCs, respectively. The plurality of indicators include a plurality of precursor powers of the plurality of equalizer circuits, respectively.

In an embodiment, the apparatus comprises a Time-Interleaved ADC including the plurality of ADCs.

In an embodiment, a method comprises measuring a plurality of indicators of a plurality of sampling time skews, respectively. The plurality of sampling time skews are associated with a plurality of Analog to Digital Converter circuits (ADCs), respectively. The method further comprises adjusting the plurality of sampling time skews according to respective indicators of the plurality of indicators.

In an embodiment, adjusting the plurality of sampling time skews includes adjusting the plurality of sampling time skews according to integrals of the respective indicators.

In an embodiment, adjusting the plurality of sampling time skews includes delaying a plurality of sampling clocks of the plurality of ADCs according to the plurality of indicators, respectively.

In an embodiment, the method further includes producing an equilibrium state wherein the plurality of indicators is substantially equal to each other.

In an embodiment, the plurality of indicators includes a plurality of outputs of Timing Error Detection circuits (TEDs) coupled to the plurality of ADCs, respectively.

In an embodiment, measuring the plurality of indicators includes determining a plurality of precursor powers of a plurality of equalizer circuits coupled to the plurality of ADCs, respectively.

DETAILED DESCRIPTION

Figure 1:
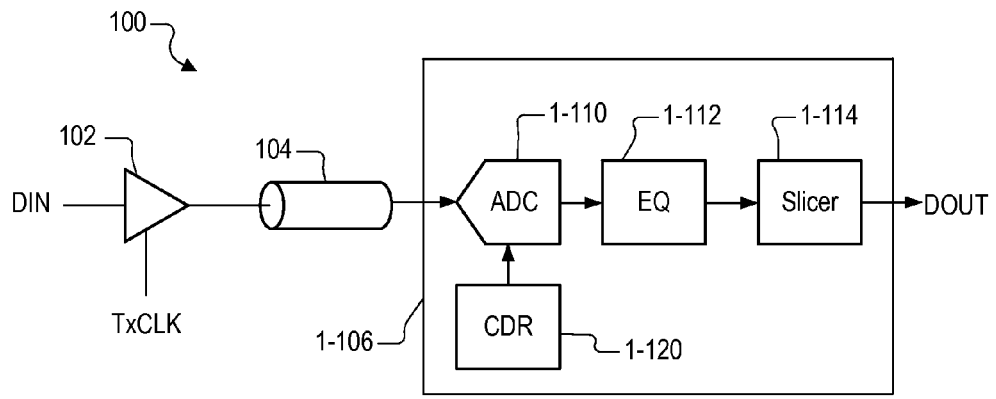
FIG. 1 illustrates a communication link according to an embodiment.

FIG. 1 shows a communication link 100 according to an embodiment. The communications link includes a transmitter 102, a channel 104, and a receiver 1-106. The receiver 1-106 includes an Analog to Digital Converter circuit (ADC) 1-110, an equalizer circuit (EQ) 1-112, a slicer circuit 1-114, and a Clock and Data Recovery circuit (CDR) 1-120. In an embodiment, the receiver 1-106 is included in an integrated circuit.

The transmitter 102 receives input data DIN and a transmit clock TxCLK. The transmitter 102 generates symbols based on the input data DIN and transmits the symbols into the channel 104 at a rate determined by the transmit clock TxCLK, each symbol being transmitted in a Unit Interval (UI) equal to the inverse of a frequency of the transmit clock TxCLK.

The channel 104 propagates the symbols from the transmitter 102 to the receiver 1-106. As the symbols are propagated, properties of the channel 104 cause modification of the symbols. In particular, dispersions and reflections in the channel 104 may change the propagation time of portions of energy used to transmit the symbol. As a result, energy from more than one symbol may arrive simultaneously at the receiver 1-106, producing Inter-Symbol Interference (ISI). In addition, the channel 104 may introduce noise and other distortions into the symbols.

The ADC 1-110 receives the energy from the channel 104, samples it, and converts the samples into a digital signal. A frequency and a phase of the conversions performed by the ADC 1-110 is determined by a clock signal the ADC 1-110 receives from the CDR 1-120. In an embodiment, the ADC 1-110 is a Time-Interleaved ADC (TI-ADC).

Because of ISI and other imperfections introduced by the channel, the phase (that is, the temporal offset within the UI) at which the ADC 1-110 samples the output of the channel 104 substantially affects the accuracy and noise rejection of the conversion performed by the ADC 1-110. Accordingly, the CDR 1-120 is configured to adjust the phase of the clock signal provided to the ADC 1-110 so that the ADC 1-110 samples the output of the channel 104 at a time within the sampling interval when the Signal-to-Noise Ratio (SNR) is near a peak. In an embodiment, the sampling interval is substantially equal to the UI.

The EQ 1-112 processes the signals produced by the ADC 1-110 to reduce an effect of ISI and other properties of the channel 104. The slicer 1-114 evaluates the output of the EQ 1-112 to produce a data out signal DOUT corresponding to the received symbols. In an embodiment, the slicer 1-114 determines the data out signal DOUT by comparing the output of the EQ 1-112 to one or more thresholds.

Figure 2:
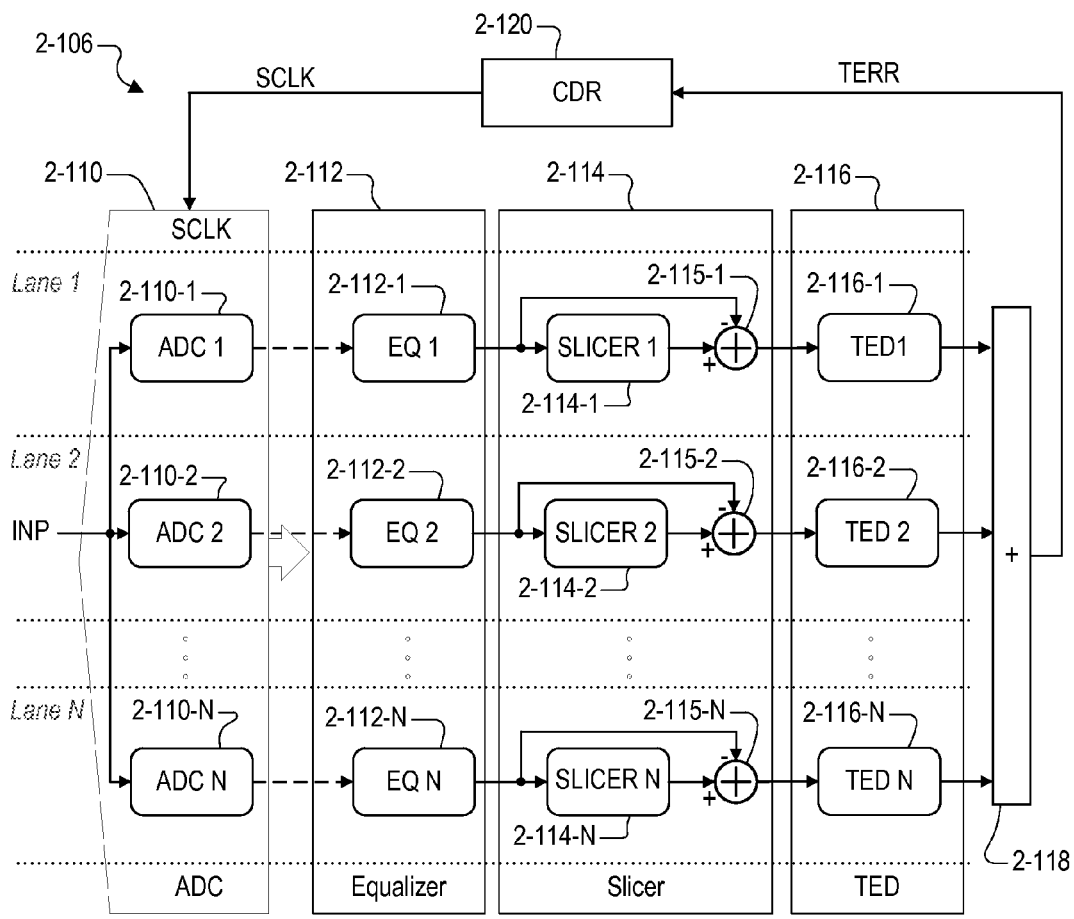
FIG. 2 is a diagram of a receiver circuit according to an embodiment.

FIG. 2 is a block diagram of a receiver circuit (or receiver) 2-106 suitable for use in the receiver 1-106 according to an embodiment. The receiver circuit 2-106 includes a TI-ADC 2-110, a Time-Interleaved Equalizer (TI-EQ) 2-112, a Time-Interleaved slicer (TI-slicer) 2-114, and a Time-Interleaved Timing Error Detection circuit (TI-TED) 2-116. The receiver circuit 2-106 also includes a CDR 2-120.

The TI-ADC 2-110 includes first through $N^{th}$ ADCs, 2-110-1 through 2-110-N, each sampling and converting an input signal INP during respective first through $N^{th}$ sampling intervals. Corresponding first through $N^{th}$ sampling clocks for each of the first through $N^{th}$ ADCs, 2-110-1 through 2-110-N, are generated according to the sampling clock SCLK, which determines a phase of the first through $N^{th}$ sampling clocks.

Each of the first through $N^{th}$ ADCs, 2-110-1 through 2-110-N, may have a different gain and a different DC offset relative to each other. A person of skill in the art in light of the teachings and disclosures herein would understand how to compensate for the different gain and DC offset of the first through $N^{th}$ ADCs, 2-110-1 through 2-110-N, to improve the operational uniformity of the first through $N^{th}$ ADCs, 2-110-1 through 2-110-N.

Each of the first through $N^{th}$ ADCs, 2-110-1 through 2-110-N, may have a different sampling time skew relative to each other. That is, the difference between the phase of the sampling clock SCLK and a time at which sampling of the input signal INP is performed may vary among the first through $N^{th}$ ADCs, 2-110-1 through 2-110-N.

The non-uniform sampling time skews of the first through $N^{th}$ ADCs, 2-110-1 through 2-110-N, may introduce distortion into the sampled signals and degrade the performance of the receiver 2-106. Embodiments of the present disclosure operate to adjust the sampling time skews of the first through $N^{th}$ ADCs, 2-110-1 through 2-110-N, in order to reduce or substantially eliminate the non-uniformity in the sampling time skew.

The TI-EQ 2-112 includes first through $N^{th}$ equalizers (EQs), 2-112-1 through 2-112-N, each receiving and equalizing an output of the respective first through $N^{th}$ ADCs, 2-110-1 through 2-110-N. Each of the first through $N^{th}$ EQs, 2-112-1 through 2-112-N, equalizes the respective received signals using a respective coefficient set that includes a plurality of coefficients. In an embodiment, all of the first through $N^{th}$ EQs, 2-112-1 through 2-112-N, use the same coefficient set.

In an embodiment, the correspondence between the first through $N^{th}$ EQs, 2-112-1 through 2-112-N, and the first through $N^{th}$ ADCs, 2-110-1 through 2-110-N, is a logical correspondence, and the outputs of the first through $N^{th}$ ADCs, 2-110-1 through 2-110-N, are multiplexed into a single composite ADC signal and then de-multiplexed for delivery to the respective first through $N^{th}$ EQs, 2-112-1 through 2-112-N. In another embodiment, each of the first through $N^{th}$ EQs, 2-112-1 through 2-112-N, receives the output of the respective first through $N^{th}$ ADCs, 2-110-1 through 2-110-N, through respective first through $N^{th}$ connections.

The TI-slicer 2-114 includes first through $N^{th}$ slicers, 2-114-1 through 2-114-N, each receiving an output of the respective first through $N^{th}$ EQs, 2-112-1 through 2-112-N. Each of the first through $N^{th}$ slicers, 2-114-1 through 2-114-N, produces a respective data out signal by performing a comparison of the output of the respective first through $N^{th}$ EQs, 2-112-1 through 2-112-N, to one or more thresholds. The data out signals of the first through $N^{th}$ slicers, 2-114-1 through 2-114-N, may be combined to produce a received data out signal of the receiver 2-106.

First through $N^{th}$ summing circuits, 2-115-1 through 2-115-N, determine first through $N^{th}$ differences between the outputs of the first through $N^{th}$ EQs, 2-112-1 through 2-112-N, and the data out signal produced by the corresponding first through $N^{th}$ slicers, 2-114-1 through 2-114-N, respectively.

First through N$^{th}$ Timing Error Detection circuits (TEDs), 2-116-1 through 2-116-N, produce first through N$^{th}$ timing error signals using the first through N$^{th}$ differences. The first through N$^{th}$ timing error signals are summed by adder 2-118 to produce a total timing error signal TERR.

The receiver 2-106 thus time-interleaves the processing of the input signal INP using N logical lanes, each lane including an ADC, an equalizer, a slicer, and a TED. Lane 1 includes the first ADC 2-110-1, first EQ 2-112-1, first slicer 2-114-1, first summing circuit 2-115-1, and first TED 2-116-1; Lane 2 includes the second ADC 2-110-2, second EQ 2-112-2, second slicer 2-114-2, second summing circuit 2-115-2, and second TED 2-116-2; and so on.

The CDR 2-120 produces the sampling clock SCLK according to the total timing error signal TERR. In an embodiment, the CDR 2-120 adjusts the phase of the sampling clock SCLK until the total timing error signal TERR is substantially zero.

Figure 3A:
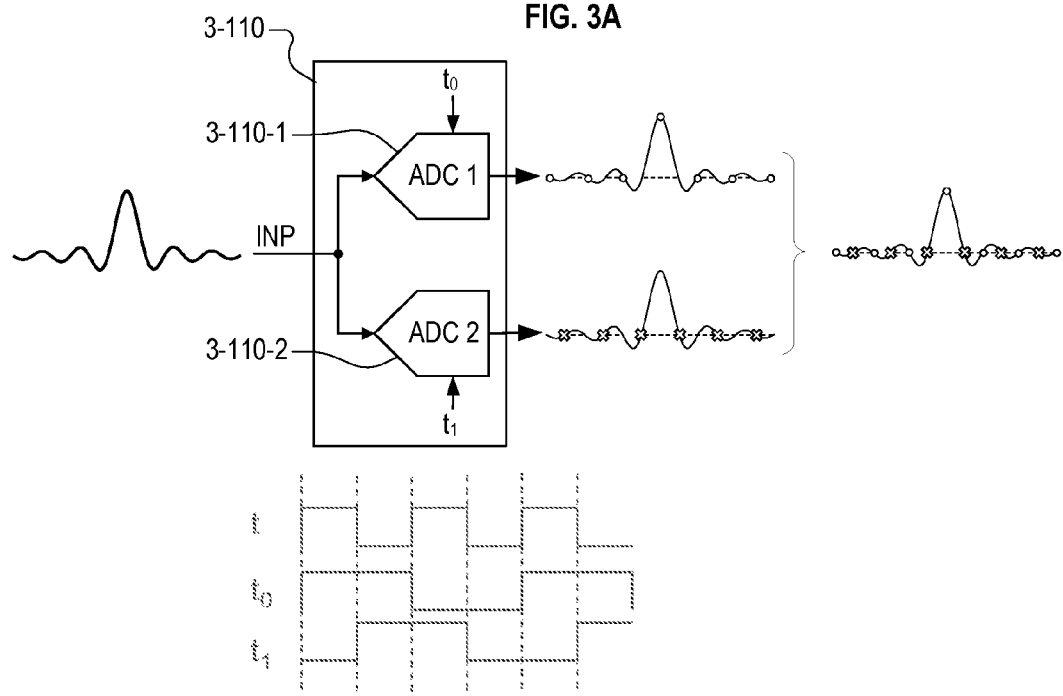
FIGS. 3A and 3B illustrate effects of sampling time skew.
Figure 3B:
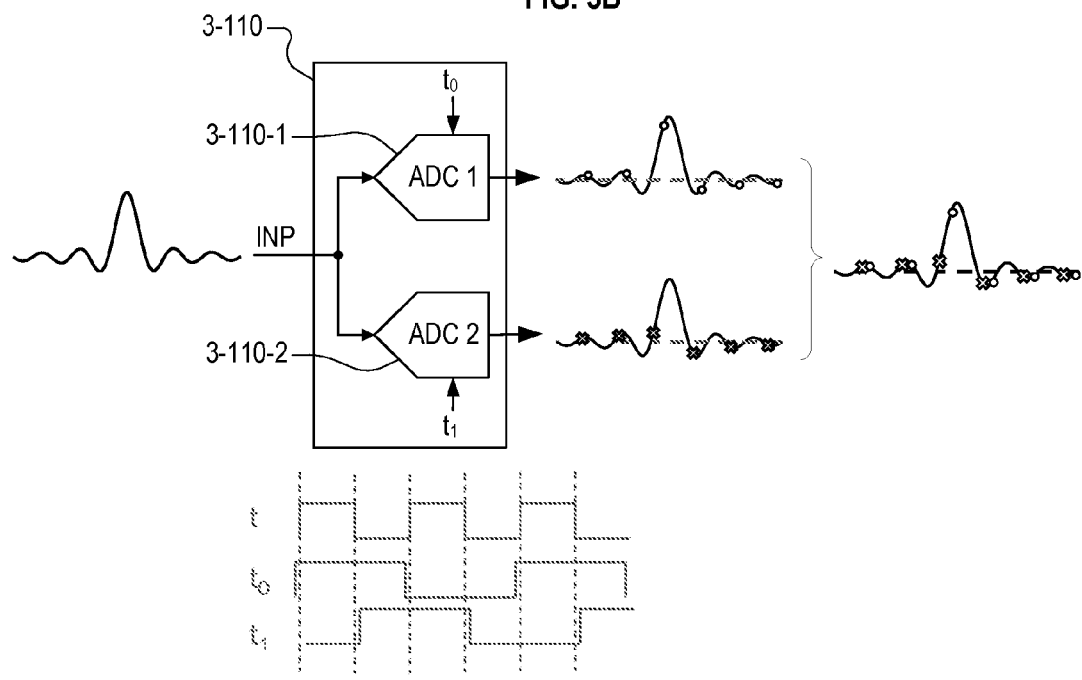

FIGS. 3A and 3B demonstrate the effects of sampling time skews. FIG. 3A shows a 2-times TI-ADC 3-110 including first and second ADCs 3-110-1 and 3-110-2. A sampling clock t operates to have edges occurring once each first sampling period, and first and second interleaved sampling clocks $t_0$ and $t_1$ operate to have edges occurring once each second sampling period, the second interleaved sampling clock $t_1$ being delayed by one sampling period relative to the first interleaved sampling clock $t_0$.

The first ADC 3-110-1 performs a sampling and conversion of an input signal INP at each edge of the first interleaved sampling clock $t_0$, and the second ADC 3-110-2 performs a sampling and conversion of the input signal INP at each edge of the second interleaved sampling clock $t_1$. A circle on a graph of the input signals INP indicates a time when the input signals INP is sampled and converted by the first ADC 3-110-1, and an "X" marks a time when the input signals INP is sampled and converted by the second ADC 3-110-2.

In FIG. 3A, the first and second interleaved sampling clocks $t_0$ and $t_1$ have identical sampling time skews. As a result, the input signal INP is sampled at times substantially identical to times the input signal INP would be sampled by a single high-speed ADC performing sampling at each edge of the sampling clock t. Therefore, the composition of the output from the first and second ADCs 3-110-1 and 3-110-2 is substantially identical to the output that would have been obtained using the single high-speed ADC.

In FIG. 3B, the first and second interleaved sampling clocks $t_0$ and $t_1$ have different sampling time skews. The first interleaved sampling clocks $t_0$ is early, and the second interleaved sampling clock $t_1$ is late. Therefore, the input signal INP is sampled at times other than times the input signal INP would be sampled by a single high-speed ADC performing sampling at each edge of the sampling clock t, and the difference in the sampling times cannot be corrected by adjusting the timing of the sampling clock t. As a result, the composition of the outputs of the first and second ADCs 3-110-1 and 3-110-2 is substantially different from the output that would have been obtained using the single high-speed ADC.

Figure 4:
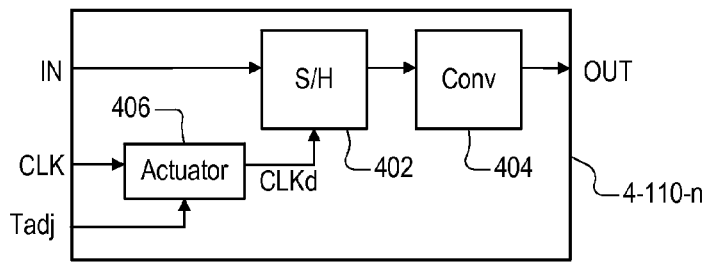
FIG. 4 is a diagram of an Analog to Digital Converter circuit (ADC) according to an embodiment.

FIG. 4 is a diagram of an Analog to Digital Converter circuit (ADC) 4-110-$n$ according to an embodiment. The ADC 4-110-$n$ is suitable for use as each of the first through N$^{th}$ ADCs, 2-110-1 through 2-110-N, of FIG. 2. The ADC 4-110-$n$ includes a Sample and Hold circuit (S/H) 402, a converter circuit 404, and an actuator 406.

The S/H 402 receives an analog input signal IN and samples it according to a phase of an output signal CLKd of the actuator 406. The S/H 402 then produces an analog output equal to the value of the input signal IN at the time of the sampling until the next sample is taken.

The converter circuit 404 converts the analog output of the S/H 402 to a digital output OUT. The converter circuit 404 may include one or more of a flash conversion circuit, a successive approximation conversion circuit, a delta-sigma conversion circuit, a pipelined conversion circuit, and the like.

The actuator 406 receives a clock signal CLK and produces an output signal CLKd having a phase determined according to the clock signal CLK and an adjustment signal Tadj. A delay between a phase of the clock signal CLK and the phase of the output signal CLKd is determined using the adjustment signal Tadj. As a result, the time at which the ADC 4-110-$n$ samples and converts the input signal IN is determined by the clock signal CLK and the adjustment signal Tadj.

In an embodiment, the actuator 406 produces the output signal CLKd by selecting a tap of a chain of buffers according to the adjustment signal Tadj, wherein an initial input of the chain of buffers is connected to the clock signal CLK. In another embodiment, the actuator produces the output signal CLKd by varying a capacitance according to the adjustment signal Tadj. A person of ordinary skill in the art in light of the teachings and disclosures herein would understand other techniques for producing the output signal CLKd having a phase delayed from a phase of the clock signal CLK according to the adjustment signal Tadj.

Figure 5:
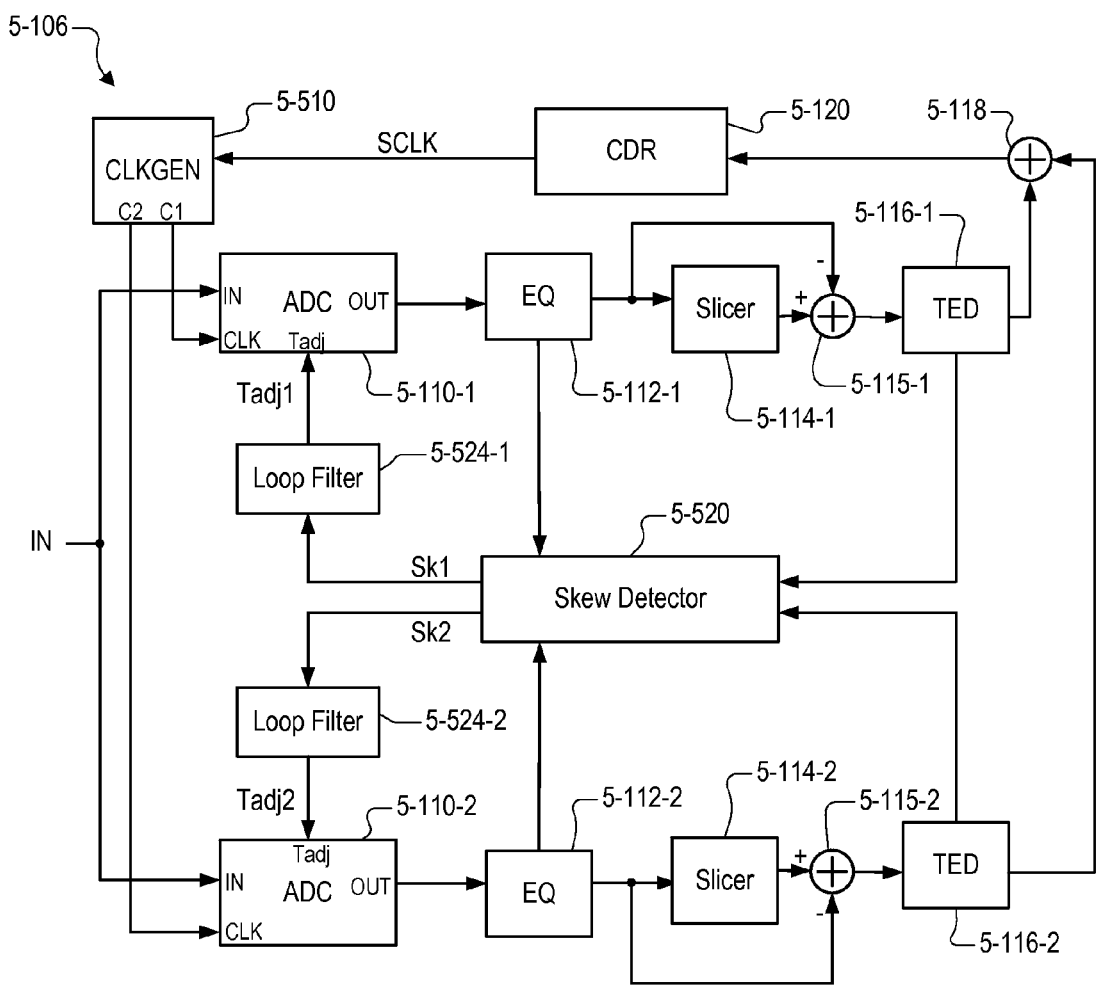
FIG. 5 is a diagram of another receiver circuit according to an embodiment.

FIG. 5 is a block diagram of a receiver circuit 5-106 suitable for use in the receiver 1-106 according to an embodiment. The receiver circuit 5-106 is configured to substantially eliminate differences in timing sampling skew between a plurality of ADCs of a time-interleaved ADC. Although FIG. 5 shows a receiver circuit 5-106 including two time-interleaved lanes, embodiments are not limited thereto.

The receiver circuit 5-106 includes first and second time-interleaved lanes. The first lane included a first Analog to Digital Converter circuit (ADC) 5-110-1, a first equalizer circuit (EQ) 5-112-1, a first slicer 5-114-1, a first summing circuit 5-115-1, and a first Timing and Error Detection circuit (TED) 5-116-1. The second lane included a second ADC 5-110-2, a second EQ 5-112-2, a second slicer 5-114-2, a second summing circuit 5-115-2, and a second TED 5-116-2. The receiver circuit 5-106 also includes a Clock and Data Recovery circuit (CDR) 5-120 and an adder 5-118. These components of receiver circuit 5-106 operate similarly to the like-numbered components of receiver circuit 2-106 described above with reference to FIG. 2.

An interleaved clock generating circuit (CLKGEN) 5-510 generates first and second interleaved clocks C1 and C2 for the first and second ADCs 5-110-1 and 5-110-2, respectively. Each of the first and second interleaved clocks C1 and C2 includes sample-triggering edges occurring once every two sampling periods. The second interleaved clock C2 is substantially identical to the first interleaved clock C1 delayed by one sampling period.

The first and second ADCs 5-110-1 and 5-110-2 each incorporate circuits such as those incorporated in the ADC 4-110-$n$ of FIG. 4. Therefore, the time at which the first and second ADCs 5-110-1 and 5-110-2 sample and convert the input signal IN is determined by the first and second clock signals C1 and C2 and the first and second adjustment signals Tadj1 and Tadj2, respectively.

The receiver circuit 5-106 further includes a skew detector 5-520. The skew detector 5-520 receives information from the first and second EQs 5-112-1 and 5-112-2 and/or the first and second TEDs 5-116-1 and 5-116-2, and determines first and second skew feedback signals Sk1 and Sk2 corresponding to sampling time skews for the first and second ADCs 5-110-1 and 5-110-2, respectively.

First and second loop filters 5-524-1 and 5-524-2 generate the first and second adjustment signals Tadj1 and Tadj2 using the first and second skew feedback signals Sk1 and Sk2, respectively. Each of the first and second loop filters 5-524-1 and 5-524-2 includes a feedback integrator and/or other feedback controls. The first and second loop filters 5-524-1 and 5-524-2 control the first and second adjustment signals Tadj1 and Tadj2 in order to drive the first and second skew feedback signals Sk1 and Sk2 towards zero.

The skew detector 5-520 and the first and second loop filters 5-524-1 and 5-524-2 are configured to produce first and second adjustment signals Tadj1 and Tadj2 that cause the sampling time skews of the first and second ADCs 5-110-1 and 5-110-2 to be substantially identical. As a result, the composition of the output from the first and second ADCs 5-110-1 and 5-110-2 is substantially identical to the output that would have been obtained using a single ADC.

In an embodiment, the skew detector 5-520 and the first and second loop filters 5-524-1 and 5-524-2 are configured to correct differences in the sampling time skews between the first and second ADCs 5-110-1 and 5-110-2, and the sampling timing of the first and second ADCs 5-110-1 and 5-110-2 is also jointly adjusted by the CDR 5-120 controlling the SCLK.

Figure 6A:
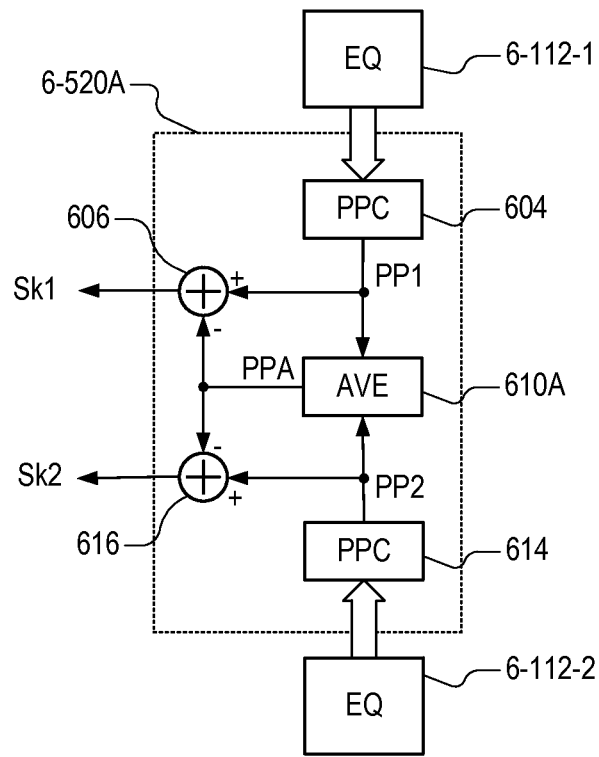
FIGS. 6A and 6B are diagrams of skew detector circuits according to embodiments.

FIG. 6A shows a skew detector 6-520A suitable for use as the skew detector 5-520 in the receiver circuit 5-106 of FIG. 5. The skew detector 6-520A includes first and second precursor power calculators (PPCs) 604 and 614, averaging circuit 610A, and first and second summing circuits 606 and 616. In the skew detector 6-520A, a difference between outputs PP1 and PP2 of the first and second PPCs 604 and 614 operates as an indirect measure of a difference in the sampling times of the first and second ADCs 5-110-1 and 5-110-2.

The first and second PPCs 604 and 614 receive the coefficients from the first and second equalizers (EQs) 6-112-1 and 6-112-2. In an embodiment, the coefficients of the first and second EQs 6-112-1 and 6-112-2 are determined using first and second Least Mean Square (LMS) adaptation loops, respectively.

The first PPC 604 calculates a first precursor power PP1 using the coefficients of the first EQ 6-112-1. The first precursor power PP1 may be determined using Equation 1, below, wherein c1[k] is the $k^{th}$ coefficient of the first EQ 6-112-1, cursor represents the position of the cursor within the coefficients, and c1[0] is the earliest of the precursor coefficients:

$$PP1 = \sum_{0}^{cursor-1} |c1[k]|^2 \quad \text{Equation 1}$$

The second PPC 614 operates similarly to the first PPC 604 to calculate a second precursor power PP2 using the coefficients of the second EQ 6-112-2. The second precursor power PP2 may be determined using Equation 2, below, wherein c2[k] is the $k^{th}$ coefficient of the second EQ 6-112-2, cursor represents the position of the cursor within the coefficients, and c2[0] is the earliest of the precursor coefficients:

$$PP2 = \sum_{0}^{cursor-1} |c2[k]|^2 \quad \text{Equation 2}$$

The averaging circuit 610A determines an average precursor power PPA by averaging together the first and second precursor powers PP1 and PP2. The average precursor power PPA is subtracted from the first and second precursor powers PP1 and PP2 by the first and second summing circuits 606 and 616 to produce the first and second skew feedback signals Sk1 and Sk2, respectively.

In the receiver circuit 5-106 of FIG. 5, the first and second skew feedback signals Sk1 and Sk2 of the skew detector 6-520A act on the first and second ADCs 5-110-1 and 5-110-2 to produce an equilibrium condition wherein the first and second precursor powers PP1 and PP2 are substantially identical, and the first and second skew feedback signals Sk1 and Sk2 are substantially zero. The receiver circuit 5-106 using the skew detector 6-520A is configured to drive the coefficients of the first and second EQs 5-112-1 and 5-112-2 to have equal partial power. However, the coefficients of the first and second EQs 5-112-1 and 5-112-2 are not necessarily driven to be identical.

Figure 6B:
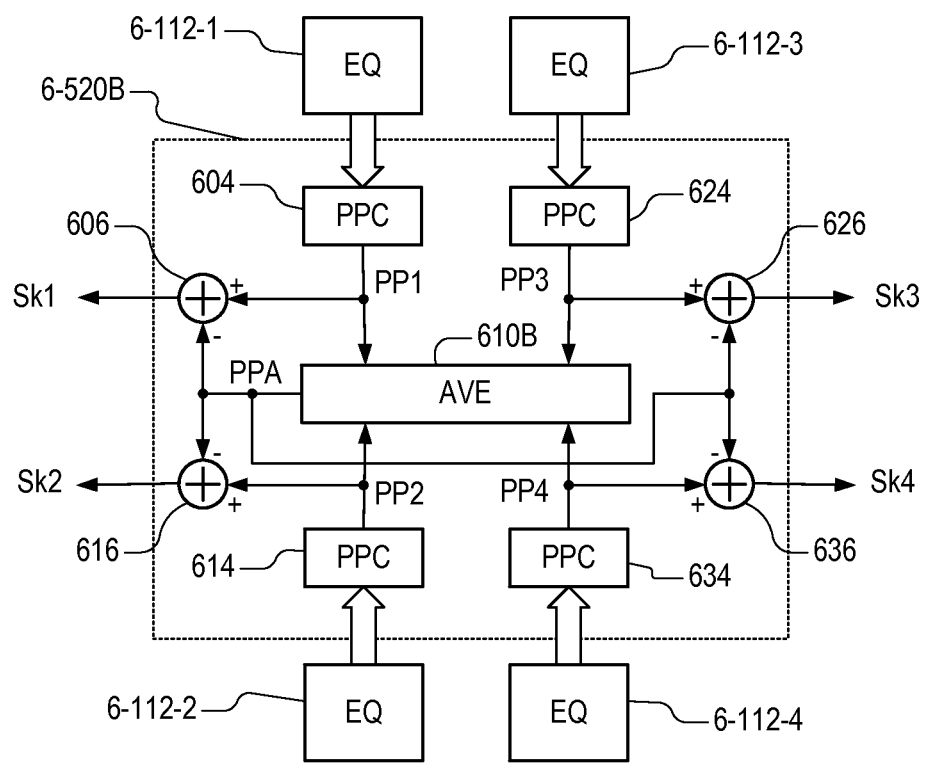

FIG. 6B shows a skew detector 6-520B similar to the skew detector 6-520A of FIG. 6A, but scaled up for use in a four-way time-interleaved receiver. Compared to the skew detector 6-520A of FIG. 6A, the skew detector 6-520B further includes third and fourth PPCs 624 and 634 and third and fourth summing circuits 626 and 636 to generate third and fourth skew feedback signals Sk3 and Sk4.

The third and fourth PPCs 624 and 634 receive coefficients from third and fourth EQs 6-112-3 and 6-112-4 and determine third and fourth precursor powers PP3 and PP4, respectively, in the same manner as the first and second PPCs 604 and 614. The averaging circuit 610B computes the average precursor power PPA of the first through fourth precursor powers PP1 through PP4. The first through fourth skew feedback signals Sk1 through Sk4 are determined by subtracting the average precursor power PPA from the first through fourth precursor powers PP1 through PP4, respectively.

Figure 7:
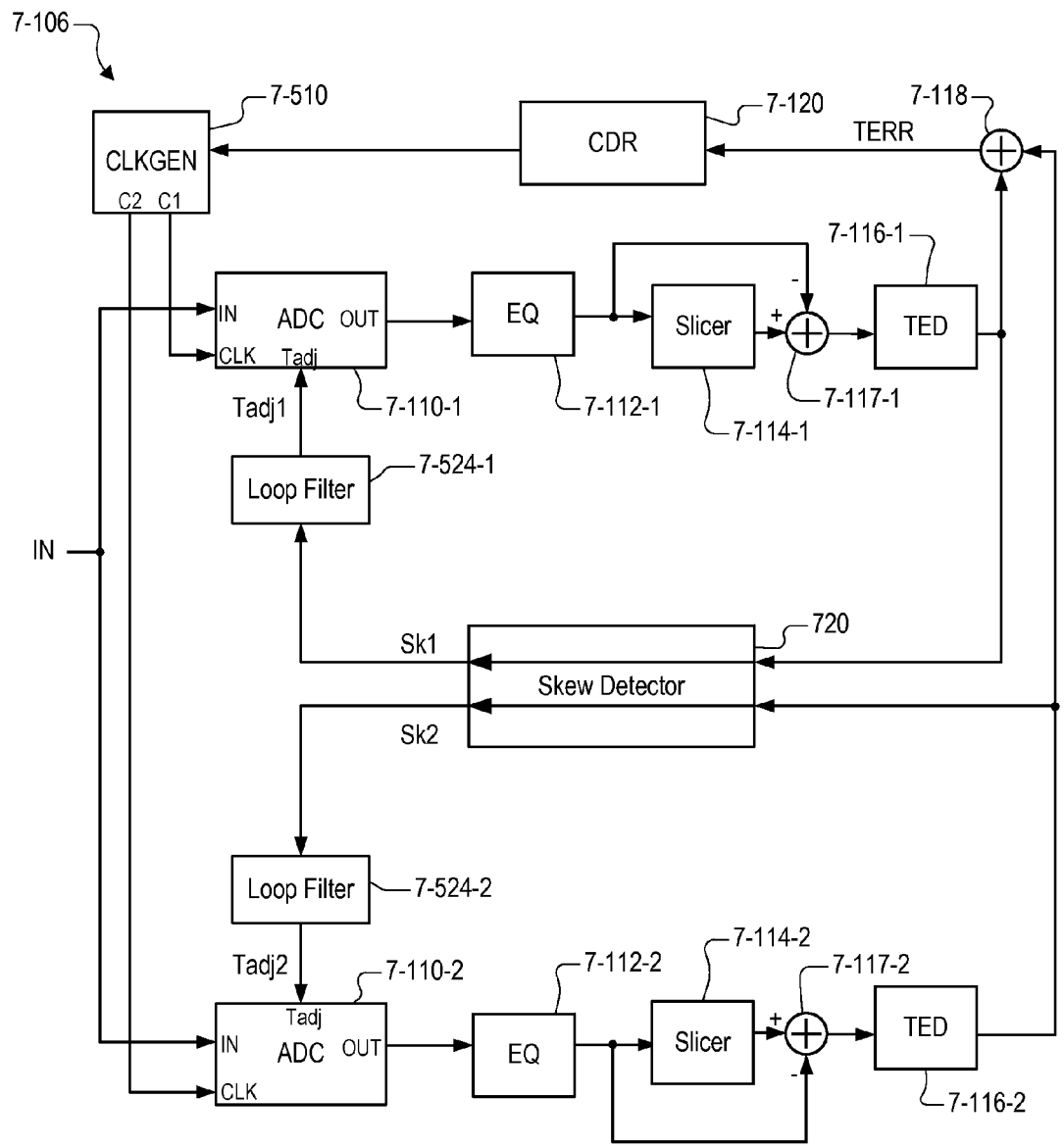
FIG. 7 is a diagram of another receiver circuit according to an embodiment.

FIG. 7 shows a receiver circuit 7-106 according to an embodiment. FIG. 7 is similar to FIG. 5, and like-numbered elements of FIG. 7 are substantially identical to like-numbered components shown in FIG. 5. Accordingly, descriptions of the like-number components of FIG. 7 are omitted in the interest of brevity.

In the skew detector 720 of FIG. 7, the individual outputs of the first and second TED 7-116-1 and 7-116-2 are used to generate the first and second skew feedback signals Sk1 and Sk2. In an embodiment of the receiver circuit 7-106, the first and second EQ 7-112-1 and 7-112-2 use identical coefficients, and a difference in the outputs of the first and second TED 7-116-1 and 7-116-2 is attributable to a difference in the sampling time skews between first and second ADCs 7-110-1 and 7-110-2.

A first feedback loop including a CDR 7-120 drives the total timing error signal TERR produced by the adder 7-118 to be substantially zero. However, the first feedback loop including the CDR 7-120 may not drive the outputs of the first and second TED 7-116-1 and 7-116-2 to be substantially zero.

The output of the first TED 7-116-1 is used as the first skew feedback signals Sk1. Using the first skew feedback signals Sk1, the loop filter 7-524-1 generates the first adjustment signals Tadj1. The action of the first adjustment signals Tadj1 on the first ADC 7-110-1 drives the output of the first TED 7-116-1 towards zero. That is, a second feedback loop including the first loop filter 7-524-1 is configured to achieve an equilibrium condition where the output of the first TED 7-116-1 is substantially zero.

The output of the second TED 7-116-2 is used as the second skew feedback signals Sk2. Using the second skew feedback signals Sk2, the loop filter 7-524-2 generates the second adjustment signals Tadj2. The action of the second adjustment signals Tadj2 on the second ADC 7-110-2 drives the output of the second TED 7-116-2 towards zero. That is, a third feedback loop including the second loop filter 7-524-2 is configured to achieve an equilibrium condition where the output of the second TED 7-116-2 is substantially zero.

Figure 8:
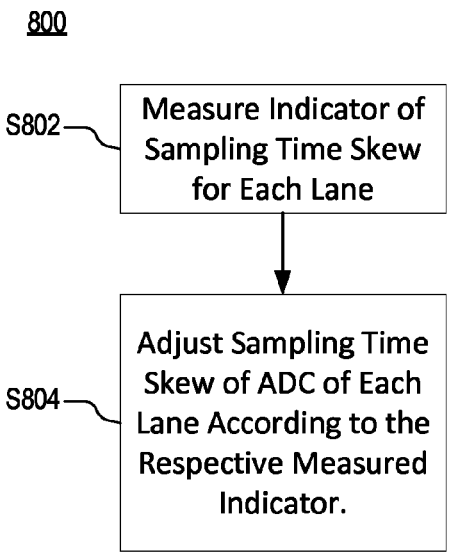
FIG. 8 is a flowchart of a process of adjusting sampling time skews of a time-interleaved ADC according to an embodiment.

FIG. 8 is a flowchart of a process 800 of adjusting sampling time skews in a time-interleaved ADC according to an embodiment.

At S802, an indicator of a sampling time skew is measured for each of a plurality of lanes. In an embodiment, the indicator includes a timing error measured using a timing error detection circuit of each lane. In another embodiment, the indicator includes a precursor power of an equalizer circuit of each lane.

At S804, the sampling time skew of an ADC of each lane is adjusted according to the respective measured indicator. In an embodiment, each measured indicator is provided to a respective loop filter, and each loop filter produces an adjustment signal that adjusts the sampling time skew of the respective ADC. In an embodiment, the loop filter includes an integrator.

In an embodiment, repetition of the process 800 drives the indicator for each lane to be substantially zero. In an embodiment, repetition of the process 800 drives the indicator for each lane to be substantially equal to the indicator for each other lane.

Figure 9:
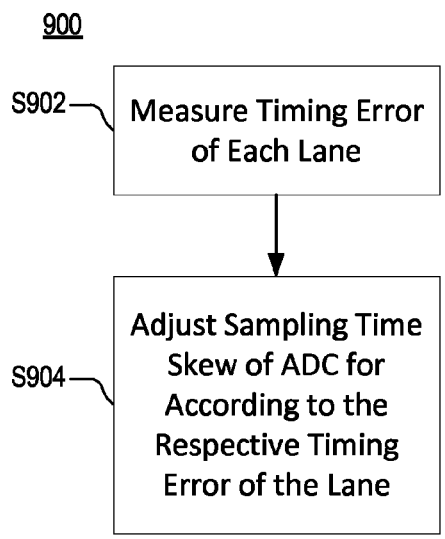
FIG. 9 is a flowchart of a process of adjusting sampling time skews of a time-interleaved ADC according to an embodiment.

FIG. 9 is a flowchart of a process 900 of adjusting sampling time skews in a time-interleaved ADC according to an embodiment.

At S902, a timing error is measured for each of a plurality of lanes. In an embodiment, the timing error is measured using a Timing Error Detection circuit (TED). A sum of the timing errors of each lane may be used to drive a Clock and Data Recovery (CDR) circuit.

In an embodiment, an equalizer of each lane uses the same coefficients as each equalizer of each other lane. In an embodiment, the coefficients are determined using a Least Means Square (LMS) adaptation.

At S904, the sampling time skew of an ADC of each lane is adjusted according to the respective timing error. In an embodiment, each timing error is provided to a respective loop filter, and each loop filter produces an adjustment signal that adjusts the sampling time skew of the respective ADC. In an embodiment, each loop filter includes an integrator.

In an embodiment, repetition of the process 900 drives the timing error for each lane to be substantially zero.

Figure 10:
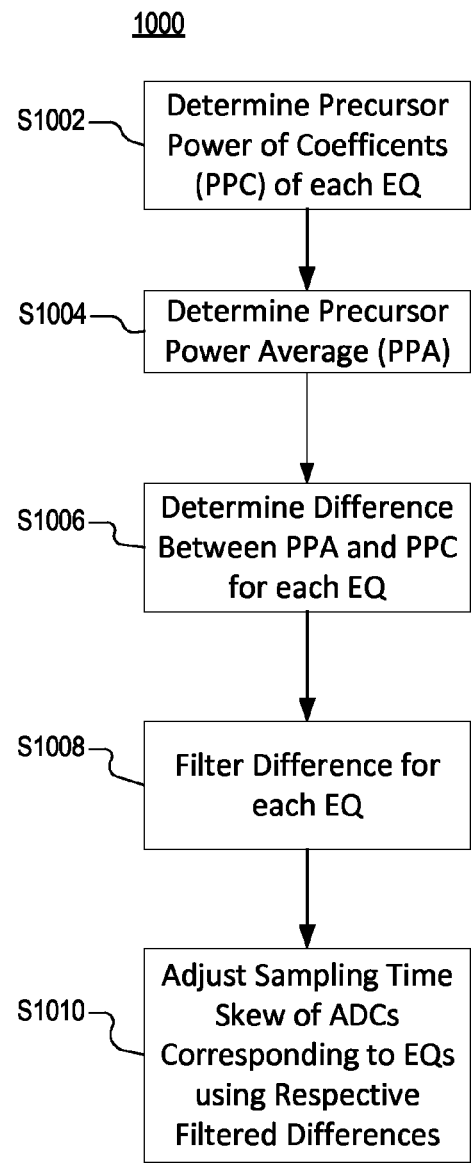
FIG. 10 is a flowchart of process of adjusting sampling time skews of a time-interleaved ADC according to an embodiment.

FIG. 10 is a flowchart of a process 1000 of adjusting sampling time skews in a time-interleaved ADC according to an embodiment.

At S1002, a precursor power of the coefficients (PPC) of an equalizer (EQ) of each lane is determined. Each equalizer of each lane uses independently determined coefficients. The PPC of each equalizer is determined by summing the squares of the pre-cursor coefficients of the equalizer. In an embodiment, the coefficients of each equalizer are determined using a Least Means Square (LMS) adaptation for each lane.

At S1004, a precursor power average (PPA) is determined using the PPCs of each lane. At S1006, a difference is determined for each lane between the respective PPC of the lane and the PPA.

At S1008, the differences are filtered using respective loop filters. In an embodiment, each loop filter includes a respective integrator. In an embodiment, each loop filter includes a respective feedback control.

At S1010, sampling time skews of ADCs of each lane are adjusted using the respective filtered differences.

In an embodiment, repetition of the process 1000 drives the PPC for each lane to be substantially identical to the PPC of each other lane.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. An apparatus, comprising:
   a plurality of Analog to Digital Converter circuits (ADCs); and
   a skew detector configured to determine a plurality of indicators corresponding to a plurality of sampling time skews of the plurality of ADCs, respectively,
   wherein the plurality of ADCs is configured to adjust the plurality of sampling time skews according to the plurality of indicators, respectively, and
   wherein the apparatus is configured to reach an equilibrium state wherein the plurality of indicators are substantially equal.

2. The apparatus of claim 1, further comprising a plurality of equalizer circuits coupled to the plurality of ADCs, respectively, and wherein the plurality of indicators include a plurality of precursor powers of the plurality of equalizer circuits, respectively.

3. The apparatus of claim 2, wherein the plurality of equalizer circuits each includes a plurality of precursor coefficients,
   wherein the plurality of precursor coefficients of each equalizer circuit of the plurality of equalizer circuits is determined independently of the plurality of precursor coefficients of each other equalizer circuit of the plurality of equalizer circuits, and
   wherein the precursor power of each equalizer corresponds to a sum of squares of absolute values of the precursor coefficients.

4. The apparatus of claim 3, further comprising an averaging circuit configured to determine an average of the plurality of precursor powers,
   wherein the plurality of ADCs is configured to adjust the respective sampling time skews according to the respective differences between the plurality of precursor powers and the average of the plurality of precursor powers.

5. The apparatus of claim 1, wherein the apparatus is provided as part of an integrated circuit.

6. The apparatus of claim 1, further comprising a Time-Interleaved ADC including the plurality of ADCs.

7. The apparatus of claim 6, wherein the plurality of ADCs is configured to adjust the plurality of sampling time skews according to a plurality of integrals of the plurality of indicators, respectively.

8. The apparatus of claim 6, wherein the plurality of ADCs is configured to adjust the plurality of sampling time skews by delaying a plurality of sampling clock signals according to the plurality of indicators, respectively.

9. An apparatus, comprising:
   a plurality of Analog to Digital Converter circuits (ADCs); and
   a skew detector configured to determine a plurality of indicators corresponding to a plurality of sampling time skews of the plurality of ADCs, respectively, wherein the plurality of ADCs is configured to adjust the plurality of sampling time skews according to the plurality of indicators, respectively, and wherein the plurality of indicators includes a plurality of outputs of a plurality of Timing Error Detection circuits (TEDs) coupled to the plurality of ADCs, respectively.

10. The apparatus of claim 9, further comprising a plurality of equalizer circuits coupled between the plurality of TEDs and the plurality of ADCs, respectively, wherein each equalizer circuit of the plurality of equalizer circuits uses substantially same coefficients as each other equalizer of the plurality of equalizer circuits.

11. The apparatus of claim 9, wherein the plurality of ADCs is configured to adjust the plurality of sampling time skews by delaying a plurality of sampling clock signals according to the plurality of indicators, respectively.

12. A method comprising:
   measuring a plurality of indicators of a plurality of sampling time skews, respectively, the plurality of sampling time skews being associated with a plurality of Analog to Digital Converter circuits (ADCs), respectively;
   adjusting the plurality of sampling time skews according to respective indicators of the plurality of indicators; and
   producing an equilibrium state wherein the plurality of indicators is substantially equal to each other.

13. The method of claim 12, wherein adjusting the plurality of sampling time skews includes adjusting the plurality of sampling time skews according to integrals of the respective indicators.

14. The method of claim 12, wherein adjusting the plurality of sampling time skews includes delaying a plurality of sampling clocks of the plurality of ADCs according to the plurality of indicators, respectively.

15. The method of claim 12, wherein measuring the plurality of indicators includes determining a plurality of precursor powers of a plurality of equalizer circuits coupled to the plurality of ADCs, respectively.

16. The method of claim 15, wherein determining the plurality of precursor powers includes determining sums of squares of absolute values of precursor coefficients of the plurality of equalizer circuits, respectively.

17. The method of claim 15, wherein measuring the plurality of indicators include further includes:
   determining an average of the plurality of precursor powers; and
   determining a plurality of differences between the plurality of precursor powers and the average of the plurality of precursor powers, respectively.

18. A method comprising:
   measuring a plurality of indicators of a plurality of sampling time skews, respectively, the plurality of sampling time skews being associated with a plurality of Analog to Digital Converter circuits (ADCs), respectively; and
   adjusting the plurality of sampling time skews according to respective indicators of the plurality of indicators,
   wherein the plurality of indicators includes a plurality of outputs of Timing Error Detection circuits (TEDs) coupled to the plurality of ADCs, respectively.

19. The method of claim 18, wherein adjusting the plurality of sampling time skews includes delaying a plurality of sampling clocks of the plurality of ADCs according to the plurality of indicators, respectively.

* * * * *